United States Patent
Cong et al.

(10) Patent No.: US 11,848,202 B2
(45) Date of Patent: Dec. 19, 2023

(54) GROWTH MONITOR SYSTEM AND METHODS FOR FILM DEPOSITION

(71) Applicant: Applied Materials, Inc., Santa Clara, CA (US)

(72) Inventors: Zhepeng Cong, San Jose, CA (US); Mostafa Baghbanzadeh, Oakland, CA (US); Tao Sheng, Santa Clara, CA (US); Enle Choo, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/456,967

(22) Filed: Nov. 30, 2021

(65) Prior Publication Data
US 2023/0170211 A1    Jun. 1, 2023

(51) Int. Cl.
*C23C 16/455*    (2006.01)
*C23C 16/46*    (2006.01)
(Continued)

(52) U.S. Cl.
CPC .... *H01L 21/02293* (2013.01); *C23C 16/4412* (2013.01); *C23C 16/455* (2013.01);
(Continued)

(58) Field of Classification Search
CPC .......... H01L 21/02293; C23C 16/4412; C23C 16/455; C23C 16/463; C23C 16/52; G01B 17/02; G01B 17/025; H01J 37/32834; H01J 37/32844; G01N 29/036; G01N 2201/023; G01N 2201/022; G01N 2201/021
See application file for complete search history.

(56) References Cited

U.S. PATENT DOCUMENTS

| | | | | |
|---|---|---|---|---|
| 4,547,648 A | * | 10/1985 | Longeway | H03H 3/02 29/25.35 |
| 6,156,578 A | * | 12/2000 | Tom | G01G 3/13 422/62 |

(Continued)

FOREIGN PATENT DOCUMENTS

| | | |
|---|---|---|
| CN | 102337517 A | 2/2012 |
| CN | 103996605 B | 10/2016 |

(Continued)

OTHER PUBLICATIONS

International Search Report and Written Opinion dated Nov. 11, 2022 for Application No. PCT/US2022/037382.

(Continued)

*Primary Examiner* — Parviz Hassanzadeh
*Assistant Examiner* — Laureen Chan
(74) *Attorney, Agent, or Firm* — PATTERSON + SHERIDAN, LLP

(57) ABSTRACT

The present disclosure generally relates to process chambers for semiconductor processing. In one embodiment, a growth monitor for substrate processing is provided. The growth monitor includes a sensor holder and a crystal disposed in the sensor holder having a front side and a back side. An opening is formed in the sensor holder exposing a front side of the crystal. A gas inlet is disposed through the sensor holder to a plenum formed by the back side of the crystal and the sensor holder. A gas outlet is fluidly coupled to the plenum.

20 Claims, 9 Drawing Sheets

(51) Int. Cl.
  *G01B 17/02* (2006.01)
  *C23C 16/52* (2006.01)
  *C23C 16/44* (2006.01)
  *H01L 21/02* (2006.01)

(52) U.S. Cl.
  CPC ............ *C23C 16/463* (2013.01); *C23C 16/52* (2013.01); *G01B 17/02* (2013.01); *G01B 17/025* (2013.01)

(56) References Cited

U.S. PATENT DOCUMENTS

| | | | | |
|---|---|---|---|---|
| 6,295,861 | B1 * | 10/2001 | Tom | G01N 29/323 436/151 |
| 2006/0233969 | A1 | 10/2006 | White et al. | |
| 2014/0053779 | A1 * | 2/2014 | Martinson | C23C 16/52 118/723 R |
| 2015/0125591 | A1 * | 5/2015 | Hsieh | C23C 16/4402 118/712 |
| 2016/0268139 | A1 | 9/2016 | Liu et al. | |
| 2018/0166306 | A1 * | 6/2018 | Hou | H01L 21/67173 |
| 2020/0033294 | A1 * | 1/2020 | Offermanns | G01N 29/022 |
| 2020/0135520 | A1 | 4/2020 | Reuter et al. | |
| 2020/0176291 | A1 * | 6/2020 | Rinzan | H01L 21/28556 |

FOREIGN PATENT DOCUMENTS

| | | | |
|---|---|---|---|
| TW | I624553 B | 5/2018 | |
| TW | I668317 B | 8/2019 | |
| WO | 2008078944 A1 | 7/2008 | |
| WO | WO-2020057737 A1 * | 3/2020 | ............. C23C 14/24 |

OTHER PUBLICATIONS

Taiwan Office Action dated Aug. 14, 2023 for Application No. 111126855.

Taiwan Office Action dated Apr. 17, 2023 for Application No. 111126855.

* cited by examiner

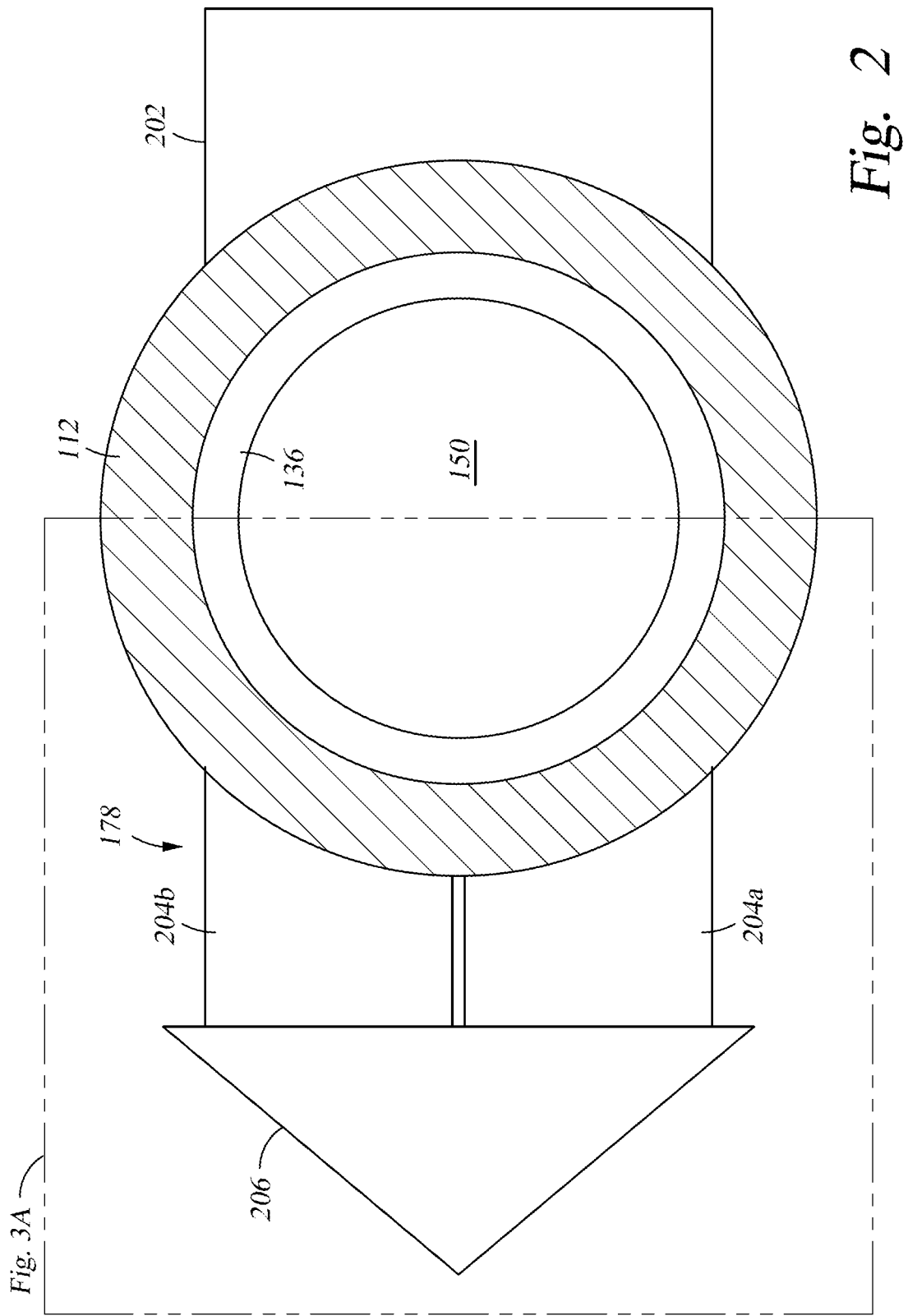

GROWTH MONITOR SYSTEM AND METHODS FOR FILM DEPOSITION

BACKGROUND

Field

Embodiments of the present disclosure generally relate to apparatus and methods for fabricating semiconductor devices. More specifically, apparatus disclosed herein relate to exhaust assemblies and growth rate sensors within a semiconductor process chamber. Methods of using the same are also disclosed.

Description of the Related Art

Semiconductor substrates are processed for a wide variety of applications, including the fabrication of integrated devices and microdevices. During processing, the substrate is positioned on a susceptor within a process chamber. The susceptor is supported by a support shaft, which is rotatable about a central axis. Precise control over a heating source is preferred to uniformly heat the substrate within strict tolerances. The temperature of the substrate can affect the uniformity of the material deposited on the substrate.

The ability to precisely control substrate temperatures within the process chamber has a significant impact on throughput and production yields. Conventional process chambers have difficulty meeting temperature control criteria needed to fabricate next generation devices while meeting ever increasing demands for improved production yields and faster throughput. During processing, process gases are flowed across a process volume within the process chamber. The process gases are flowed parallel to the substrate surface from one side of the process chamber to an opposite side of the process chamber. Heating and gas flow within the process chamber may be adjusted to improve film deposition rates across the substrates. Current sensors within the process chamber have limited lifetime which results in downtimes in additional to routine preventative maintenance downtimes of process chambers. Additional downtimes increase the cost of ownership. Substrates processed between calibration and measurement operations also have less precise deposition rates due to changes in chamber conditions.

Therefore, a need exists for a sensor assembly and method for growth rate monitoring.

SUMMARY

The present disclosure generally relates to process chambers for semiconductor processing. In one embodiment, a growth monitor for substrate processing is provided. The growth monitor includes a sensor holder and a crystal disposed in the sensor holder having a front side and a back side. An opening is formed in the sensor holder exposing a front side of the crystal. A gas inlet is disposed through the sensor holder to a plenum formed by the back side of the crystal and the sensor holder. A gas outlet is fluidly coupled to the plenum.

In another embodiment, a method for substrate processing is provided. The method includes measuring a film characteristic. The method includes flowing a process gas over a growth monitor having a crystal. The method includes flowing a back side gas over a back side of the crystal. The method includes purging a front side of the crystal using a front side purge gas. The method includes measuring the characteristic of the process gas using the crystal, wherein measuring the characteristic of the process gas occurs when the front side of the crystal is not being purged.

In another embodiment, an exhaust passage body for substrate processing is provided. The exhaust passage body includes an exhaust plenum. An exhaust entry opening is formed through a first end of the exhaust passage body and fluidly connected to the exhaust plenum. A plurality of fins is disposed adjacent to the exhaust entry opening within the exhaust plenum. An exhaust exit opening formed through a second end of the exhaust passage body and fluidly connected to the exhaust plenum. At least one growth monitor is disposed adjacent to the exhaust exit opening and configured to measure a thickness of a material deposited on the growth monitor. The at least one growth monitor includes a sensor holder and a crystal disposed in the sensor holder having a front side and a back side. An opening is formed in the sensor holder exposing a front side of the crystal. A gas inlet is disposed through the sensor holder to a plenum formed by the back side of the crystal and the sensor holder. A gas outlet fluidly coupled to the plenum.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

FIG. 2 illustrates a cross-sectional plan view of the deposition chamber of FIG. 1, according to embodiments of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to growth rate sensors within a semiconductor process chamber. The growth rate sensors are quartz crystal film thickness monitors and enable measurement of a film thickness on the growth rate sensor. The film thickness on the growth rate sensor is used to calculate a growth rate on the substrate within the process chamber. The thickness measurements are used to adjust one or more process controls within the process volume of the process chamber and improve film growth across the substrate.

Quartz crystal monitors include components that can become sensitive to process temperature and can react with process chemistries and result in corrosion. However, quartz crystal monitors as described herein are configured to reduce reaction with epitaxial deposition process chemistries, which may negatively impact either sensor performance, sensor longevity, or process conditions within the process chamber. Flowing purge gases over components of the quartz crystal monitors reduces reaction of the quartz crystal with the process chemistries, clears any debris from components of the quartz crystal monitors, and maintains temperature conditions. It has been discovered that flowing purge gases continuously over a back side of the quartz crystal efficiently controls a temperature of the crystal while keeping the back side and electrical connections clean. Additionally, methods described herein provides for flowing purge gases over a front side of the quartz crystal when the quartz crystal monitor is sampling and taking measurements. Without being bound by theory, it is believed that purging a front size of the quartz crystal also enables improved temperature control and clears deposition gases from the quartz crystal which extends the life of the quartz crystal.

The location and number of quartz crystal monitors provides increased sensitivity and sensor life cycles. The configuration of the exhaust system around the quartz crystal monitors further enables the gas flow within the process volume to remain the same or have minimal flow impact, while increasing process gas flow across the quartz crystal monitors to improve growth rate on the quartz crystal monitors.

Software algorithms within the process chamber controller take the growth rate measurements from the quartz crystal monitors and enable calibration of other sensors within the process chamber as well as process conditions within the process chamber to improve film thickness growth rates.

Figure 1:
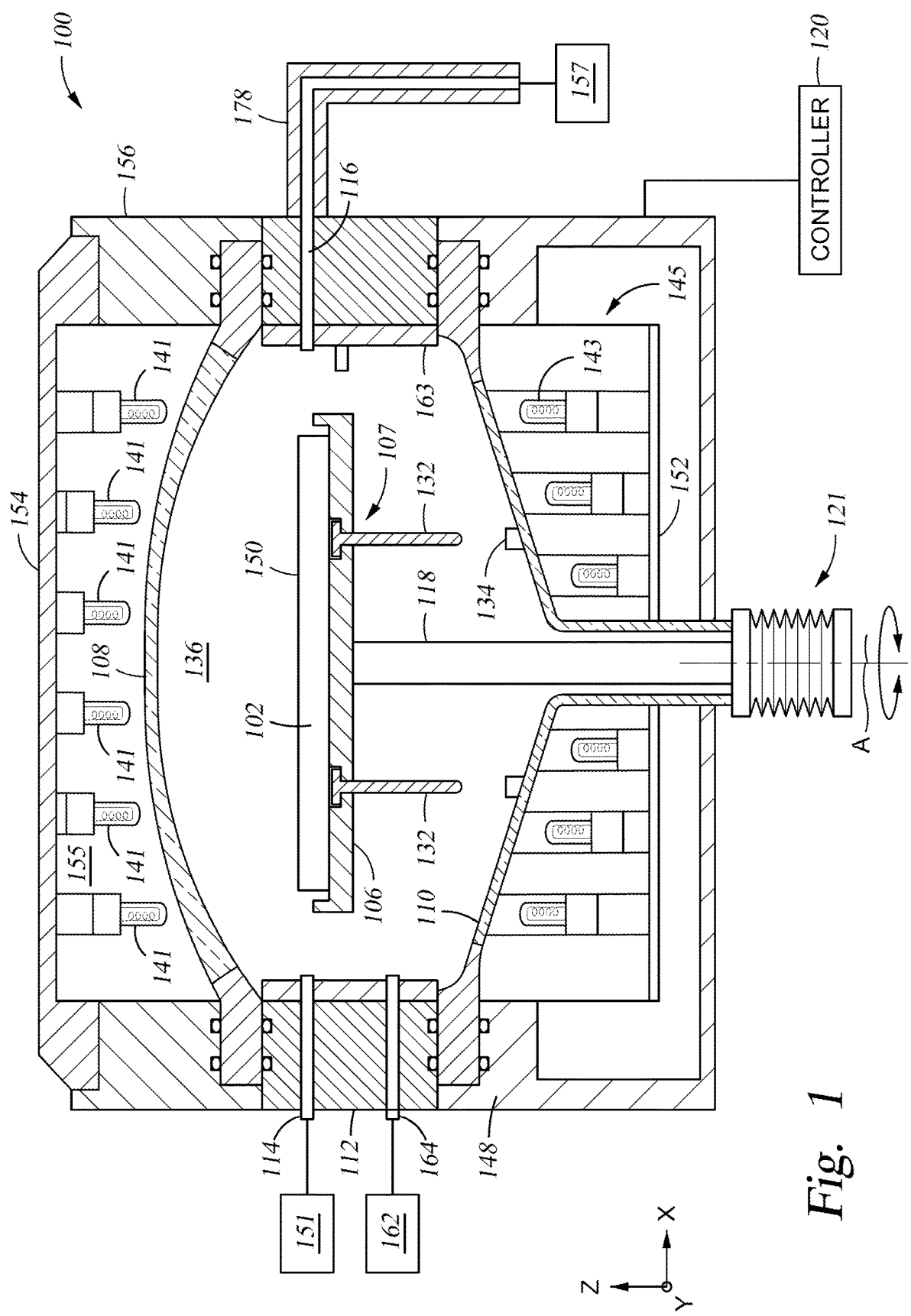
FIG. 1 is a schematic illustration of a deposition chamber, according to embodiments of the present disclosure.

FIG. 1 is a schematic illustration of a deposition chamber 100, according to embodiments of the present disclosure. The deposition chamber 100 is an epitaxial deposition chamber. The deposition chamber 100 is utilized to grow an epitaxial film on a substrate, such as the substrate 102. The deposition chamber 100 creates a cross-flow of precursors across the top surface 150 of the substrate 102.

The deposition chamber 100 includes an upper body 156, a lower body 148 disposed below the upper body 156, a flow module 112 disposed between the upper body 156 and the lower body 148. The upper body 156, the flow module 112, and the lower body 148 form a chamber body. Disposed within the chamber body is a substrate support 106, an upper window 108, a lower window 110, and a plurality of heat sources. In the implementation shown in FIG. 1, the plurality of heat sources includes a plurality of upper lamps 141, and a plurality of lower lamps 143. As shown, the controller 120 is in communication with the deposition chamber 100 and is used to control processes, such as those described herein. The substrate support 106 is disposed between the upper window 108 and the lower window 110. The plurality of upper lamps 141 are disposed between the upper window 108 and a lid 154. The plurality of upper lamps 141 form a portion of the upper lamp module 155. The lid 154 may include a plurality of sensors (not shown) disposed therein for measuring the temperature within the deposition chamber 100. The plurality of lower lamps 143 are disposed between the lower window 110 and a floor 152. The plurality of lower lamps 143 form a portion of a lower lamp module 145. The upper window 108 is an upper dome and is formed of an energy transmissive material, such as quartz. The lower window 110 is a lower dome and is formed of an energy transmissive material, such as quartz.

A process volume 136 is formed between the upper window 108 and the lower window 110. The process volume 136 has the substrate support 106 disposed therein. The substrate support 106 includes a top surface on which the substrate 102 is disposed. The substrate support 106 is attached to a shaft 118. The shaft is connected to a motion assembly 121. The motion assembly 121 includes one or more actuators and/or adjustment devices that provide movement and/or adjustment of the shaft 118 and/or the substrate support 106 within the process volume 136.

The substrate support 106 may include lift pin holes 107 disposed therein. The lift pin holes 107 are sized to accommodate a lift pin 132 for lifting of the substrate 102 from the substrate support 106 either before or after a deposition process is performed. The lift pins 132 may rest on lift pin stops 134 when the substrate support 106 is lowered from a process position to a transfer position.

The flow module 112 includes a plurality of process gas inlets 114, a plurality of purge gas inlets 164, and one or more exhaust gas outlets 116. The plurality of process gas inlets 114 and the plurality of purge gas inlets 164 are disposed on the opposite side of the flow module 112 from the one or more exhaust gas outlets 116. One or more flow guides are disposed below the plurality of process gas inlets 114 and the one or more exhaust gas outlets 116. The flow guide is disposed above the purge gas inlets 164. A liner 163 is disposed on the inner surface of the flow module 112 and protects the flow module 112 from reactive gases used during deposition processes. The process gas inlets 114 and the purge gas inlets 164 are positioned to flow a gas parallel to the top surface 150 of a substrate 102 disposed within the process volume 136. The process gas inlets 114 are fluidly connected to a process gas source 151. The purge gas inlets 164 are fluidly connected to a purge gas source 162. The one or more exhaust gas outlets 116 are fluidly connected to an exhaust pump 157.

The one or more exhaust gas outlets 116 are further connected to or include an exhaust system. The exhaust system fluidly connects the one or more exhaust gas outlets 116 and the exhaust pump 157. The exhaust system as described herein includes one or more growth monitors 310 (FIG. 3A) and is configured to assist in the controlled deposition of a layer on the substrate 102.

FIG. 2 illustrates a cross-sectional plan view of the deposition chamber 100 of FIG. 1, according to embodiments of the present disclosure. The deposition chamber 100 includes an injector 202 disposed across from the exhaust system 178. The injector 202 includes the process gas inlets 114 and is fluidly coupled to the process gas source 151. The injector 202 may be disposed through at least a portion of the flow module 112 or may be a part of the flow module 112. The exhaust system 178 is disposed on the opposite side of the process volume 136 from the injector 202. The exhaust system 178 is formed through, attached to, or a part of the flow module.

The exhaust system 178 further includes at least one exhaust passage body 204a, 204b. The exhaust passage bodies 204a, 204b form an exhaust path for gas leaving the process volume 136 before entering an exhaust collector 206. As shown in FIG. 2, there is a first exhaust passage body 204a and a second exhaust passage body 204b. The first exhaust passage body 204a and the second exhaust passage body 204b are mirror images and may be similar in size and configuration. In other embodiments, there may be more or less exhaust passage bodies 204a, 204b. In some embodiments, there is only one exhaust passage body, such that the two exhaust passage bodies 204a, 204b are merged into a single body.

Both of the first exhaust passage body 204a and the second exhaust passage body 204b are coupled to the exhaust collector 206 on the opposite end of the exhaust passage bodies 204a, 204b from the process volume 136. The exhaust collector 206 is configured to collect the exhaust from the first exhaust passage body 204a and the second exhaust passage body 204b. The exhaust collector 206 narrows as the exhaust collector 206 extends away from the exhaust passage bodies 204a, 204b.

Figure 3A:
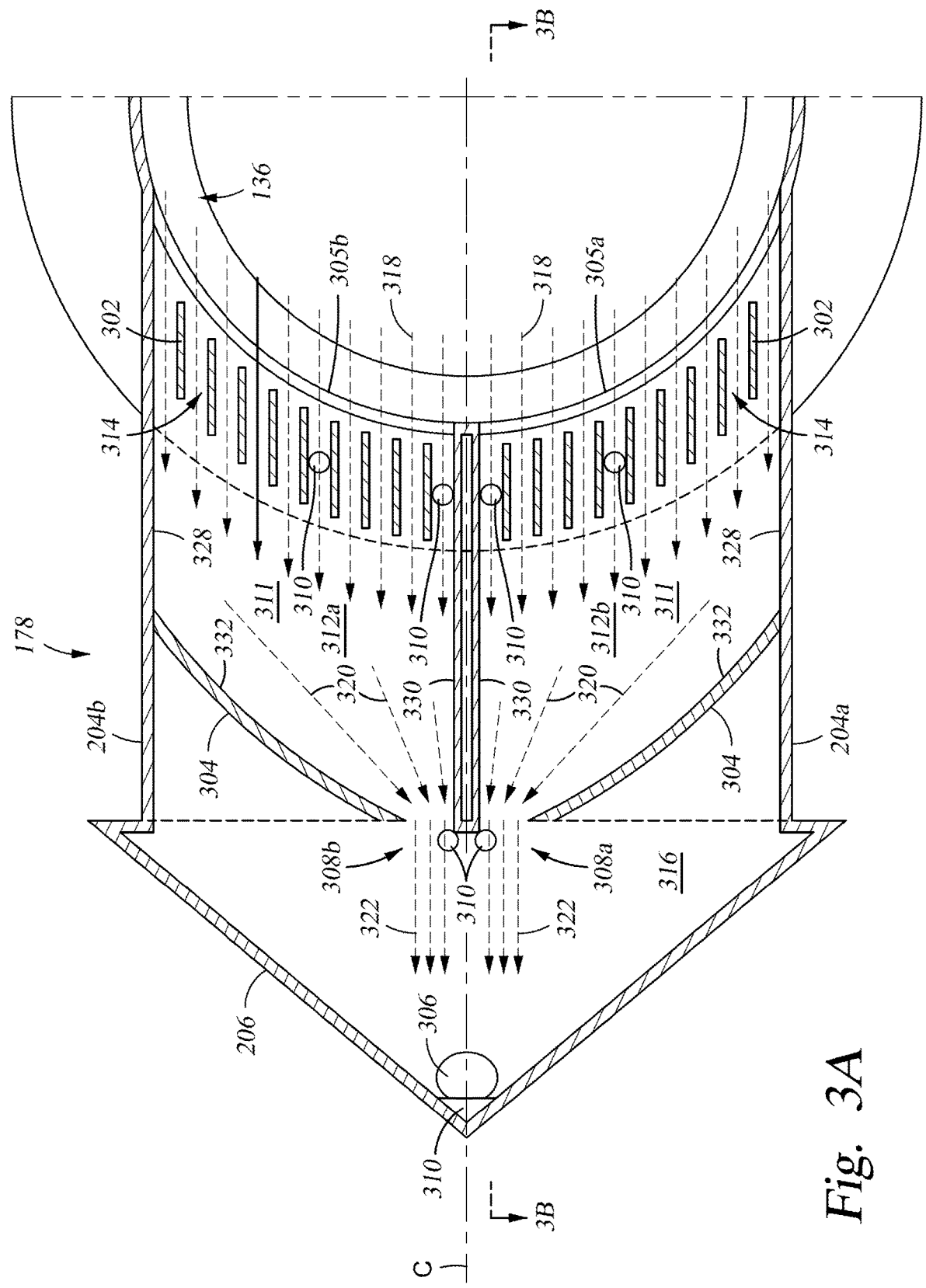
FIG. 3A illustrates a cross-sectional plan view of the exhaust system of the deposition chamber of FIG. 1, according to embodiments of the present disclosure.

FIG. 3A illustrates a cross-sectional plan view of the exhaust system 178 of the deposition chamber 100 of FIG. 1, according to embodiments of the present disclosure. The exhaust system 178 is configured to control the exhaust gas flow exiting the process volume 136 before being flowed over one or more growth monitors 310. A fin array 314 and one or more baffles 304 are positioned within each of the exhaust passage bodies 204a, 204b to enable the narrowing of the exhaust passage bodies 204a, 204b, while reducing the impact of the narrowing on the flow path of the process gases through the process volume 136.

As the process gas flows out of the process volume 136 and into the exhaust system 178, the process gas is flowing in a first flow path 318. The first flow path 318 is primarily parallel with the surface of the substrate 102 and the gas flow out of the injector 202. The process gas is flowed into the exhaust system 178 through an exhaust entry opening 305a, 305b disposed through each of the exhaust passage bodies 204a, 204b. Therefore, a first exhaust entry opening 305a is disposed through a first end of the first exhaust passage body 204a, while a second exhaust entry opening 305b is disposed through a first end of the second exhaust passage body 204b. The exhaust entry openings 305a, 305b are in fluid communication with exhaust plenums 312a, 312b. The exhaust plenums 312a, 312b are disposed within each of the exhaust passage bodies 204a, 204b. Therefore, a first exhaust plenum 312a is disposed within the first exhaust passage body 204a and a second exhaust plenum 312b is disposed within the second exhaust passage body 204b. The first exhaust entry opening 305a is in fluid communication with the first exhaust plenum 312a and the second exhaust entry opening 305b is in fluid communication with the second exhaust plenum 312b.

An exhaust exit opening 308a, 308b is disposed on the opposite side of the exhaust passage bodies 204a, 204b from the exhaust entry openings 305a, 305b. Therefore, a first exhaust exit opening 308a is disposed on a second side of the first exhaust passage body 204a opposite the first side and in fluid communication with the first exhaust plenum 312a. The second exhaust exit opening 308b is disposed on a second side of the second exhaust passage body 204b opposite the first side and in fluid communication with the second exhaust plenum 312b. The exhaust exit openings 308a, 308b are smaller in width than the exhaust entry openings 305a, 305b.

Process gases flowing through the deposition chamber 100 enter the exhaust passage bodies 204a, 204b through the exhaust entry openings 305a, 305b while in the first flow path 318 before changing to a second flow path 320 as one or more baffles 304 narrows the exhaust plenums 312a, 312b adjacent the exit openings 308a, 308b. The second flow path 320 brings the process gases towards a center line C of the exhaust system and towards one side of the exhaust plenums 312a, 312b, such as the inner side of the exhaust plenums 312a, 312b. Once the process gases are flowed through the exit openings 308a, 308b, the path of the process gases changes to a third flow path 322. The third flow path 322 is a condensed flow path. The third flow path 322 is disposed through the collector plenum 316. The collector plenum 316 is a plenum disposed within the exhaust collector 206.

The fin arrays 314 disposed within each of the exhaust passage bodies 204a, 204b are configured to maintain the first flow path 318 through at least a portion of the exhaust plenums 312a, 312b. The fin arrays 314 include a plurality of fins 302, such that a first plurality of fins 302 are disposed within the first exhaust plenum 312a of the first exhaust passage body 204a. A second plurality of fins 302 are disposed within the second exhaust plenum 312b and the second exhaust passage body 204b. The fin arrays 314 are configured to maintain flow control through the process volume 136 and extend from a position adjacent to the exhaust entry openings 305a, 305b.

One or more growth monitors 310 are disposed within the fin arrays 314, such as between two adjacent fins 302. There may be two or more growth monitors 310 disposed within each fin array 314 of both the first exhaust passage body 204a and the second exhaust passage body 204b. The growth monitors 310 within the fin arrays 314 may assist in providing measurements of the growth rate at different radial positions on the substrate 102.

Each of the fins 302 within the fin arrays 314 are parallel to one another. The fins 302 extend in a direction parallel to the desired first flow path 318 and parallel to the gas flowing out of the injector 202. Other configurations of the fin arrays 314 are contemplated.

Once the process gases leave the fin arrays 314, the process gases are flown into the main portion 311 of the exhaust plenums 312a, 312b. The main portion 311 of the exhaust plenums 312a, 312b is an open space and may assist in reducing backpressure which would build up if the fin arrays 314 extended all the way to the baffle plate 304.

The baffle plate 304 extends from an outer surface 328 of each of the exhaust passage bodies 204a, 204b and towards an inner surface 330 of each of the exhaust passage bodies 204a, 204b. The outer surface 328 is the inside surface of the exhaust plenums 312a, 312b furthest from the centerline C. The inner surface 330 is the inside surface of the exhaust plenums 312a, 312b closes to the centerline C. Therefore, the baffle plate 304 within the first exhaust passage body 204a extends from the outer surface 328 of the first exhaust plenum 312a and towards the inner surface 330 of the first exhaust passage plenum 312a or the centerline C of the exhaust system 178. The baffle plate 304 within the second exhaust passage body 204b extends from the outer surface 328 of the second exhaust plenum 312b and towards the inner surface 330 of the second exhaust passage plenum 312b or the centerline C of the exhaust system 178.

The exhaust exit openings 308a, 308b are disposed between an innermost portion of each of the baffle plates 304 and the inner surface 330 of each of the exhaust plenums 312a, 312b. The first exhaust exit opening 308a is disposed within the first exhaust plenum 312a and connects the first exhaust plenum 312a to the collector plenum 316. The second exhaust exit opening 308b is disposed within the second exhaust plenum 312b and connects the second exhaust plenum 312b to the collector plenum 316.

One or more growth monitors 310 are located either within the exhaust exit openings 308a, 308b or just downstream of the exhaust exit openings 308a, 308b. A first growth monitor 310 is disposed within the first exhaust exit opening 308a or just downstream of the exhaust exit opening 308a. A second growth monitor 310 is disposed within the second exhaust exit opening 308b or just downstream of the second exhaust exit opening 308b. The growth monitors 310 being disposed just downstream of the exhaust exit openings 308a, 308b is defined as the growth monitors 310 being disposed within 10 mm of the exhaust exit openings 308a, 308b and away from the fin arrays 314.

The baffle plates 304 narrow the passage through which exhaust gases pass through the exhaust plenums 312a, 312b and therefore increase the density or concentration of the exhaust gases flowing over the growth monitors 310. The growth monitors 310 are disposed in either a top surface 326 or a bottom surface 327 (FIG. 3B) of the exhaust plenums 312a, 312b so that the growth monitors 310 do not block the third flow path 322, but are instead disposed in line with the third flow path 322. The growth monitors 310 are located at least partially inside of the collector plenum 316.

Figure 3B:
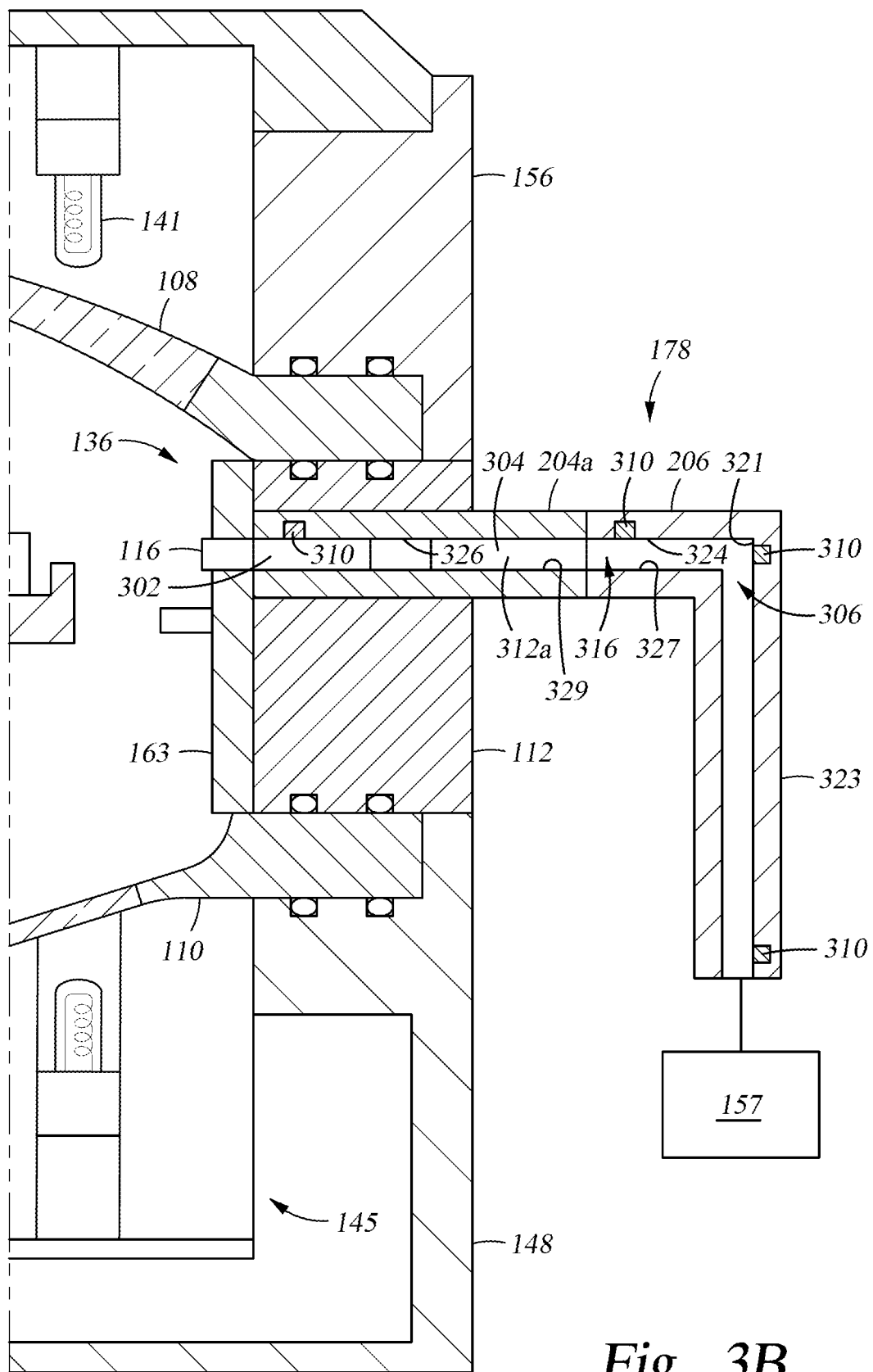
FIG. 3B illustrates a cross-sectional side view of the exhaust system of the deposition chamber of FIG. 1, according to embodiments of the present disclosure.

Exhaust gas passes over the growth monitors 310 and into the collector plenum 316 before being removed from the exhaust collector 206 through a conduit opening 306 of the exhaust conduit 323 (FIG. 3B).

The conduit opening 306 is disposed at a portion of the collector plenum 316 opposite the exit openings 308a, 308b. The conduit opening 306 is configured to enable venting of the exhaust gas within the exhaust collector 206 through an exhaust conduit 323 and to an exhaust pump 157. Adjacent to the conduit opening 306 and within the collector plenum 316 is another growth monitor 310. The growth monitor 310 adjacent to the conduit opening 306 is disposed on a back sidewall 321 (FIG. 3B) of the collector plenum 316 furthest from the exit openings 308a, 308b. In some embodiments, the growth monitor 310 may be disposed directly above the conduit opening 306 or within the conduit opening 306, such as within an upper portion of the exhaust conduit 323.

FIG. 3B illustrates a cross-sectional side view of the exhaust system 178 of the deposition chamber 100 of FIG. 1, according to embodiments of the present disclosure. As shown in FIG. 3B, the exhaust plenums 312a, 312b of the exhaust system 178 extend through at least a portion of the flow module 112, such that the exhaust plenums 312a, 312b extend through the flow module 112. The fins 302 are disposed adjacent to the process volume 136.

The fins 302 and the baffle plates 304 extend the full height of the exhaust plenums 312a, 312b, such that the fins 302 and the baffle plates 304 extend between the top surface 326 and the bottom surface 329 of the exhaust plenums 312a, 312b. The growth monitors within the fin arrays 314 are disposed on the top surface 326.

The exhaust collector 206 is connected to the back end of the exhaust system 178. The exhaust collector 206 includes a top surface 324, a bottom surface 327, and a back sidewall 321. The growth monitors 310 just downstream of the exhaust exit openings 308a, 308b are positioned on the top surface 324 of the collector plenum 316 within the exhaust collector 206. Another growth monitor 310 is disposed on the back sidewall 321 of the collector plenum 316. The positioning of the growth monitors 310 enables accurate film growth rate measurements by each of the growth monitors 310. The measurements from each of the growth monitors 310 may be mapped to see differences in growth rate across different positions of the substrate 102.

The conduit opening 306 is disposed through the bottom surface 327 of the collector plenum 316 and opens into the exhaust conduit 323. The exhaust conduit 323 extends downward from the conduit opening 306 and is fluidly connected to the exhaust pump 157. Another growth monitor 310 may be positioned on an inner wall of the exhaust conduit 323 downstream of the growth monitor 310 on the back sidewall 321 of the collector plenum 316.

In some embodiments, more or less growth monitors 310 may be utilized within the exhaust system 178. In some embodiments, only the growth monitors 310 adjacent to the exhaust exit openings 308a, 308b are disposed within the exhaust system 178. In other embodiments, the growth monitors 310 adjacent to the exhaust exit openings 308a, 308b may be a single growth monitor 310. In yet other embodiments, the growth monitors 310 adjacent to the exhaust exit openings 308a, 308b and the growth monitor 310 on the back sidewall 321 of the collector plenum 316 are utilized.

Figure 4A:
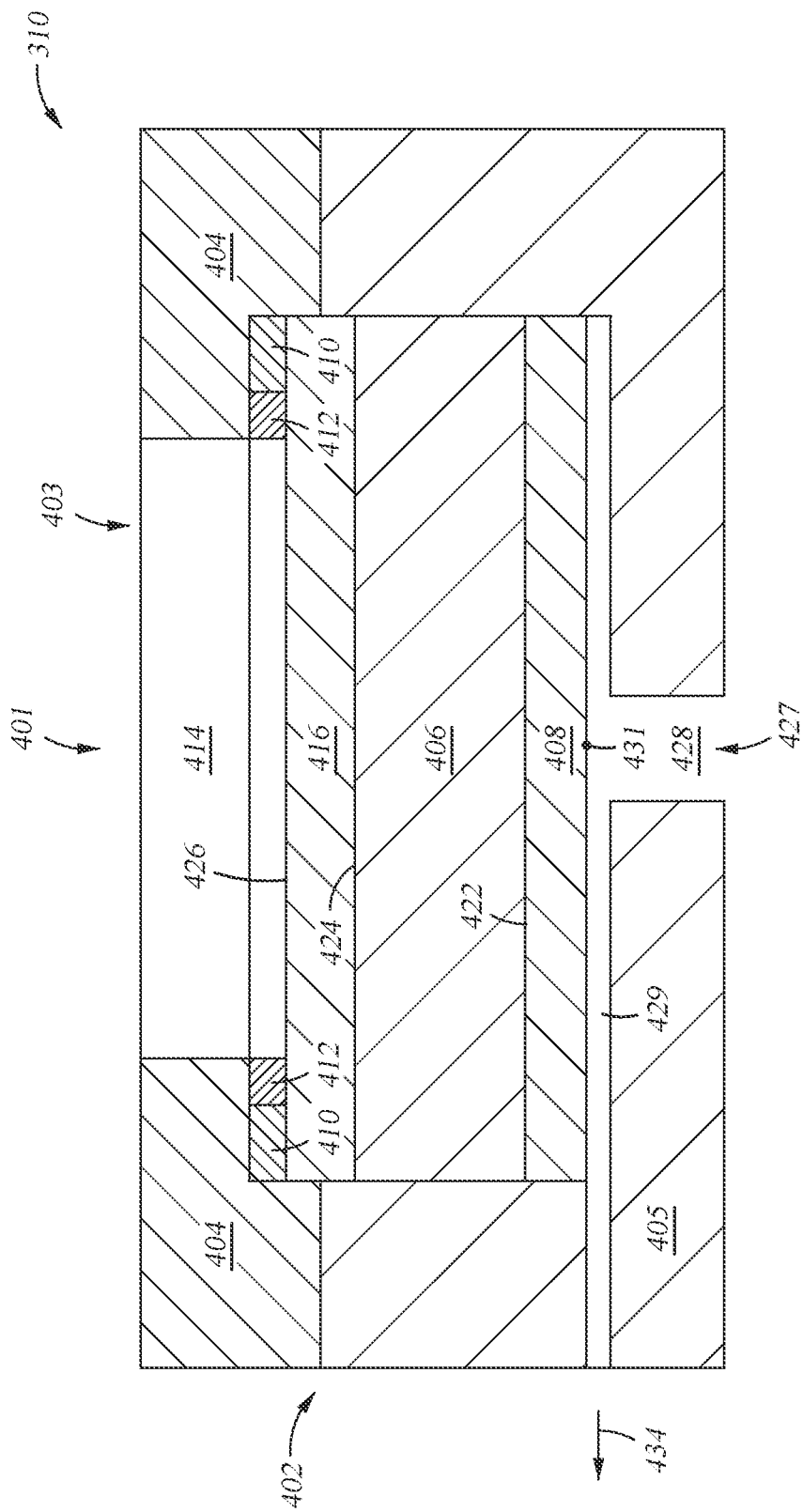
FIG. 4A illustrates a growth monitor for use within the deposition chamber of FIG. 1, according to embodiments of the present disclosure.

FIG. 4A illustrates a growth monitor 310 for use within the deposition chamber 100 of FIG. 1, according to embodiments of the present disclosure. The growth monitor 310 includes a sensor holder 402, a quartz crystal 406 disposed within the sensor holder 402, a back contact 408 contacting a first side 422 (e.g., back side) of the quartz crystal 406, a protective coating 416 disposed on the second side 424 (e.g., front side) of the quartz crystal 406, a front contact 410 contacting protective coating 416, a feed through 428 disposed through the sensor holder 402 for electrical contacts to a back side of the crystal, a gas inlet 427 in fluid communication with a back side of the crystal, and a sensor opening 414 disposed through the sensor holder 402 and exposing a front side 424 of the crystal to gases flowing through the exhaust system 178. In some embodiments, exposing the front side 424 of the crystal includes exposing the protective coating 416. In some embodiments, a plenum 429 is formed between the sensor holder 402, and the back contact 408 or the back side 422 of the crystal 406.

The growth monitors 310 are configured to be positioned within the deposition chamber 100 and therefore account for the reactive process chemistries within the exhaust system 178. The protective coating 416 as well as the material of the sensor holder 402, the back contact 408, and the front contact 410 impact the reactivity of the growth monitors 310 with the process chemistries within the deposition chamber 100. Therefore, material compositions are chosen which reduce the reactivity of the growth monitor 310 with the process chemistries within the deposition chamber 100, while still enabling accurate film thickness measurements on the growth monitors 310.

The sensor holder 402 acts as a case in which the back contact 408, the front contact 410, and the quartz crystal 406 are disposed. The sensor holder 402 is formed in multiple parts, such as a first part 405 and a second part 404. The first part 405 has a cavity formed therein in which the back contact 408 is located. The quartz crystal 406 is also located within the cavity and contacting the back contact 408. A feed through 428 is disposed through the first part 405 to the back contact 408. The feed through 428 provides access to the back side 422 of the crystal for electrical connections, such as a temperature monitor. In some embodiments, the temperature monitor 431 is a thermocouple configured to monitor a temperature of the back side 422 of the crystal. In some embodiments the temperature monitor is a probe that is attached to the backside of the crystal sensor head and is communicatively coupled to a controller (e.g., described with reference to controller 440 in FIG. 4B). Other temperature monitors are also contemplated. A back side gas inlet 427 is in fluid communication with the feed through 428 and plenum 429, such that gas is capable of being flowed into the feed through 428 and into the plenum 429. The gas exits the plenum through a gas outlet 434 to an exhaust without entering the process volume the chamber. It has been discovered that directing the purge gas to the exhaust without entering the process volume enables back side purging without affecting the process reaction within the process volume, such as chemical vapor deposition.

The second part 404 includes the sensor opening 414 disposed therethrough and is positioned over the side of the first part 405, which includes the cavity. The protective coating 416 is disposed over and directly contacts the second side 424 of the quartz crystal 406. The protective coating 416 is at least partially disposed within the sensor opening 414, such that the protective coating 416 is exposed to the exhaust gases 401 flowed through the exhaust system 178. The protective coating 416 and the quartz crystal 406 are held in place at least in part by the gripping force between the first part 405 and the second part 404. One or more sealing rings 412 are disposed within the second part 404 and contact the exposed surface 426 of the protective coating 416. The one or more sealing rings 412 are configured to provide a seal between the atmosphere within the exhaust system 178 and the other components of the growth monitor 310 which are not the protective coating 416. The front side 424 of the crystal or protective coating 416 is exposed to a front side purge gas 403 between sensor sampling. The purge gas 403 is configured to clean the protective coating 416 or front side 424 of the crystal 406 between sampling.

The protective coating 416 is formed from one of alumina ($Al_2O_3$) or a silicon oxide, such as silicon dioxide ($SiO_2$). The protective coating 416 is formed from a material which does not degrade when exposed to epitaxial deposition process conditions or process gases. The protective coating 416 may be a lens or may be a coating applied to the quartz crystal 406. The protective coating 416 has a thickness of less than about 10 μm, such as about 1 nm to about 10 nm, such as about 1 nm to about 5 nm. The small thickness enables protection of the quartz crystal 406 without significant damping of the oscillation of the quartz crystal 406. It has been discovered that purging the front side 424 of the crystal 406 protects the protective coating 416 from corrosive gases and, in some cases, enables down gauging a thickness of the protective coating 416 relative to sensors without purging.

Figure 4B:
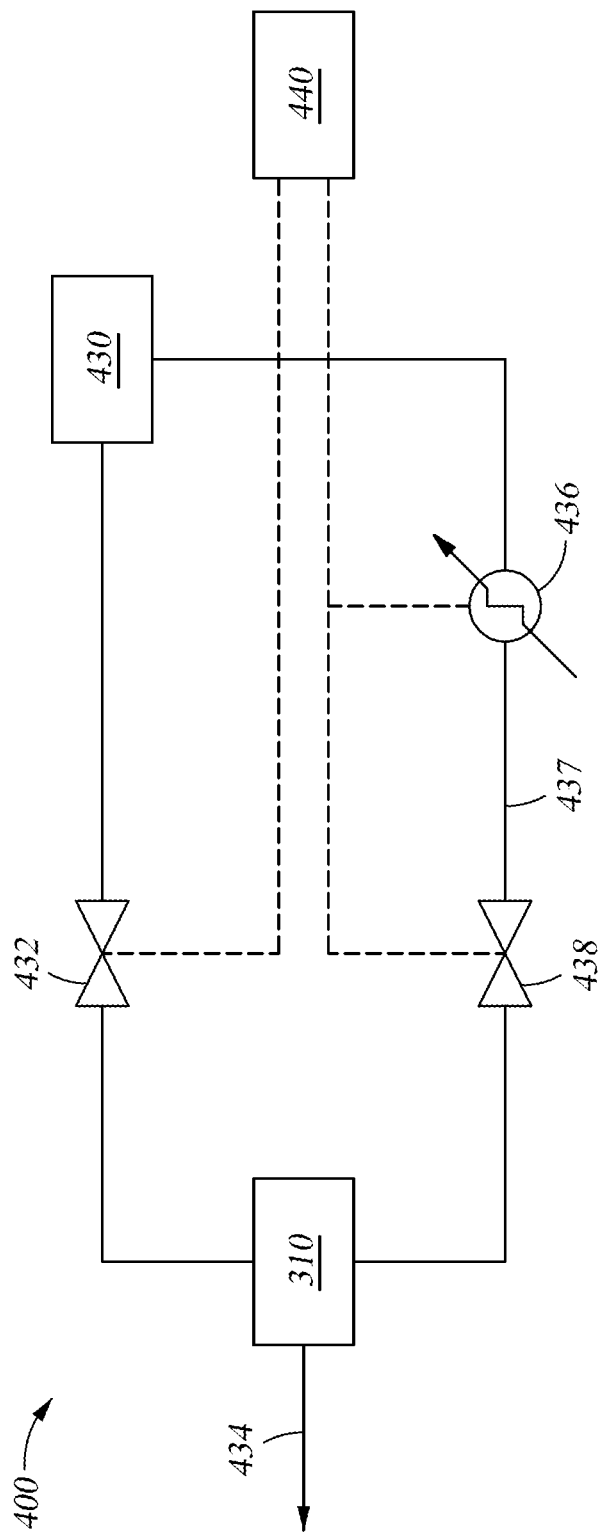
FIG. 4B illustrates a growth monitor for use within the deposition chamber of FIG. 1, according to embodiments of the present disclosure.

FIG. 4B illustrates schematic view of a growth monitoring system 400 for use within the deposition chamber 100 of FIG. 1, according to embodiments of the present disclosure. The growth monitoring system 400 includes the growth monitor 310, a front side gas inlet valve 432 coupled to a gas source 430, a back side gas inlet valve 438 coupled to the gas source 430, and a heat exchanger 436 coupled to the back side gas inlet line 437. The heat exchanger 436 is capable of heat and/or cooling the back side gas in the back side gas inlet line 437. In some embodiments, the heat exchanger 436 is a chiller. The back side gas can be purged from the growth monitoring system via the gas outlet 434. In some embodiments, the front side inlet valve 432 is a normally open pneumatic valve. The front side inlet valve 432 is communicatively coupled to a controller 440 such that the valve closes when the growth monitor is measuring a characteristic of the deposition gas, and the valve opens when the monitor is not measuring the characteristic. In some embodiments, the back side inlet valve 438 is communicatively coupled to the controller 440 and is capable of controlling a back side gas flow to the back side 422 of the crystal. The back side inlet valve 438 is a mass control valve, a restrictor, or a combination thereof. In some embodiments, the crystal is a quartz crystal microbalance (QCM). A QCM sensor measures a mass variation per unit area by measuring the change in frequency of a quartz crystal resonator. The frequency change is affected by a characteristic of the process conditions, such as temperature, pressure, and film growth rate. The QCM is capable of measuring the frequency change data which can be transformed to approximate film deposition thickness and/or film growth rate. The sensor described herein in particularly suitable for monitoring growth of films in chemical vapor deposition processes, such as epitaxy growth.

Figure 5:
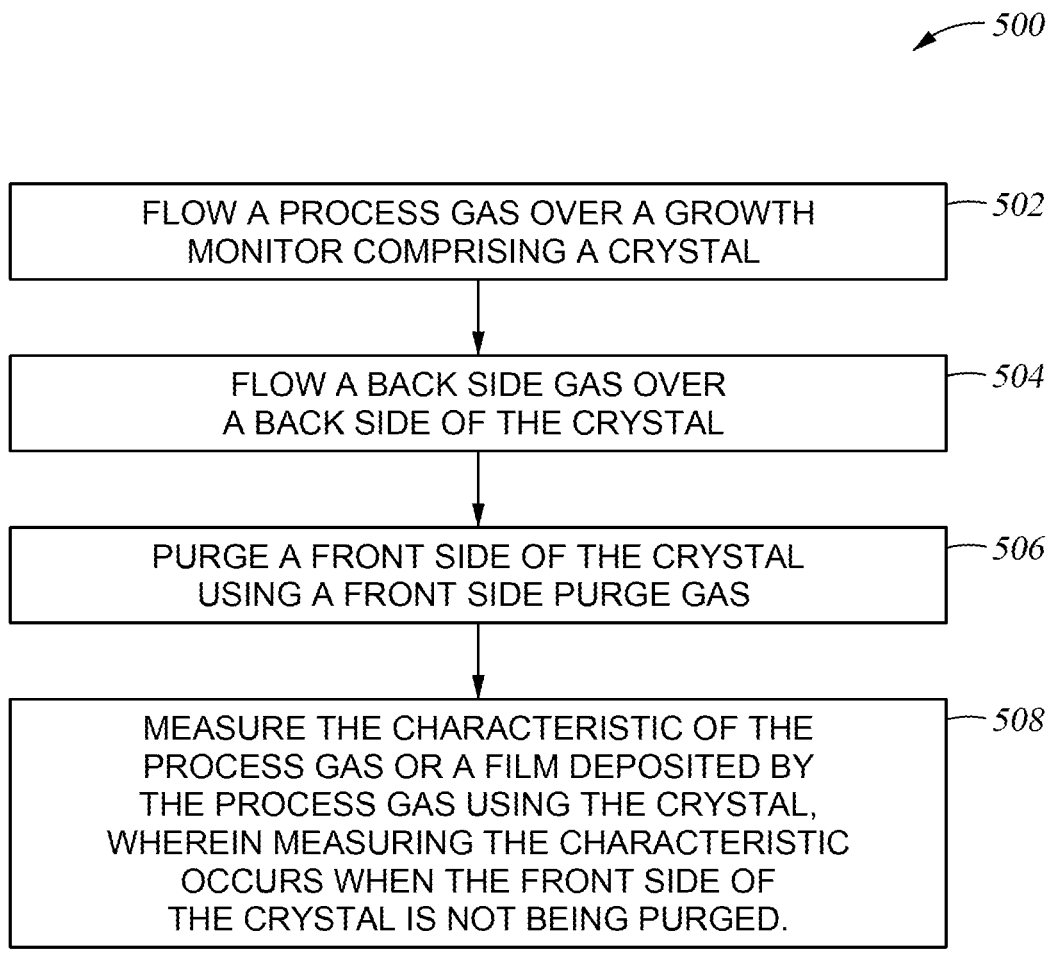
FIG. 5 depicts a block flow diagram of a method for monitoring film growth, according to embodiments of the present disclosure.

FIG. 5 depicts a block flow diagram of a method 500 for monitoring film growth. The method 500 includes flowing 502 a process gas over a growth monitor including a crystal, flowing 504 a back side gas over a back side of the crystal, purging 506 a front side of the crystal using a front side purge gas, and measuring 508 a characteristic of the process gas or a film deposited by the process gas using the crystal. Flowing 502 the process gas exposes a front side or protective coating of the crystal. In some embodiments, the flow rate of the process gases is about 5 slm to about 50 slm, such as about 20 slm to about 40 slm. In some embodiments, the pressure of the process volume is about 1 torr to about 75 torr, such as about 25 torr to about 50 torr. In some embodiments, the temperature of the substrate is maintained at about 300° C. to about 1150° C., such as about 500° C. to about 800° C. The process gas can be any gas suitable for use in epitaxy chemical vapor deposition processes.

The front side of the crystal is purged for a front side purge time and is determined based on a sampling window for measuring the characteristic of the process gas or deposited film. In some embodiments, the characteristic is a film thickness growth on a portion of the growth monitor. The characteristic can correspond to a film growth on a substrate within the process chamber. In some embodiments, the method includes calculating film growth rate over a substrate during processing using the measured characteristic. The front side purge prevents deposition on the front side of the sensor when the sensor is not used to detect deposition.

Purging the front side of the crystal is cyclically alternated with measuring the characteristic. The sample window is determined based on one or more of process deposition film thickness, process gas composition, process chamber preventative maintenance schedule, or combinations thereof. It has been discovered that that purging the front side (or protective coating) of the crystal extends the life of the crystal such that a maintenance of the crystal can be synchronized with the preventative maintenance of the process chamber, such as about 1 to 6 months, such as 2 months to 4 months. In some embodiments, measuring the characteristic using the crystal has a total sampling time of about 10% to about 100%, such as about 15% to about 50% of a total process time for processing a substrate. It has been discovered that reducing a total sampling time relative to a total process time for processing a substrate can increase the life of the crystal and extend time between preventative maintenance, such as changing out the crystals. In some embodiments, the front side of the crystal is purged for about 10 seconds to 1 hour, such as 20 seconds to 30 minutes. The sample window, such as a timing, duration, and frequency of the front side purge is controlled using an entered process recipe for each process.

The method can further include measuring a temperature of the crystal, such as at a back side of the crystal using temperature monitor 431, and adjusting the temperature of the crystal by adjusting a gas flow rate and/or a gas temperature of the back side gas. The temperature of the crystal can be maintained at a crystal temperature of about 20° C. to about 190° C., such as about 50° C. to about 140° C. Without being bound by theory, it is believed that maintaining a sensor temperature within a temperature range, enables measurement accuracy repeatability. It is further believed that the main mechanism of mass deposition on the crystal is condensation, therefore, maintaining the sensor temperature low reduces condensation on the crystal. Reduced condensation on the crystal leads to higher deposition on the substrate, and greater sensor reading sensitivity. Condensation on the crystal is particularly observed for deposition gases used in epitaxy chemical vapor deposition such as silanes ($Si_xH_y$), halogen silanes, chloride-containing compounds, boron-containing compounds, or combinations thereof. A crystal temperature range is determined based on a temperature and a pressure at which condensation begins to form on the crystal depending on the deposition gas composition. It has been discovered that the front side and/or back side purging enables improved temperature control relative to water cooling, such as water cooling through channels within the casing. Each of the front and back side purge gases can flow in substantially the same direction as the deposition gas. It is believed that flowing purge gas in the same direction as the deposition gas enables efficient clearing of deposition gas from sensor components.

In some embodiments, flowing the back side gas to the back side of the crystal includes flowing the back side gas at a first flow rate during measuring the characteristic, and flowing the back side gas at a second flow rate when not measuring the characteristic. In some embodiments, the first flow rate is higher than the second flow rate, and the back side gas is a reduced temperature relative to a crystal temperature of the crystal. In some embodiments, the second flow rate is substantially constant during processing and sampling, and can be adjusted based on the temperature reading of the crystal. Without being bound by theory, it is believed that during sensor sampling, a temperature of the crystal is increased. It has been discovered that increasing a gas flow rate over the back side of the crystal reduces the temperature of the crystal during sensing and reduces a temperature difference of the crystal between crystal sensing and non-sensing. Depending on the temperature measurement provided by the temperature monitor 431, the gas flow rate of the purge gas to the back side of the crystal can be adjust and/or the amount of heat exchange to the purge gas in heat exchanger 436 can be adjusted. In some embodiments, the control scheme of the back purge gas is a control loop that is distinct and separate from the control scheme of the front side purge gas.

In some embodiments, the back side gas is continuously flowed during purging the front side of the crystal and measuring the characteristic. The back side gas and the front side purge gas is selected from helium, hydrogen (e.g., $H_2$), nitrogen (e.g., $N_2$), argon, and a combination thereof. The flow rate of the purge gas to each of the back and front side is about 0.5 slm to about 5 slm. Although the back side gas and front side purge gas is depicted as coming from the same gas source, it is also contemplated to provide the gases from different gas sources.

Figure 6:
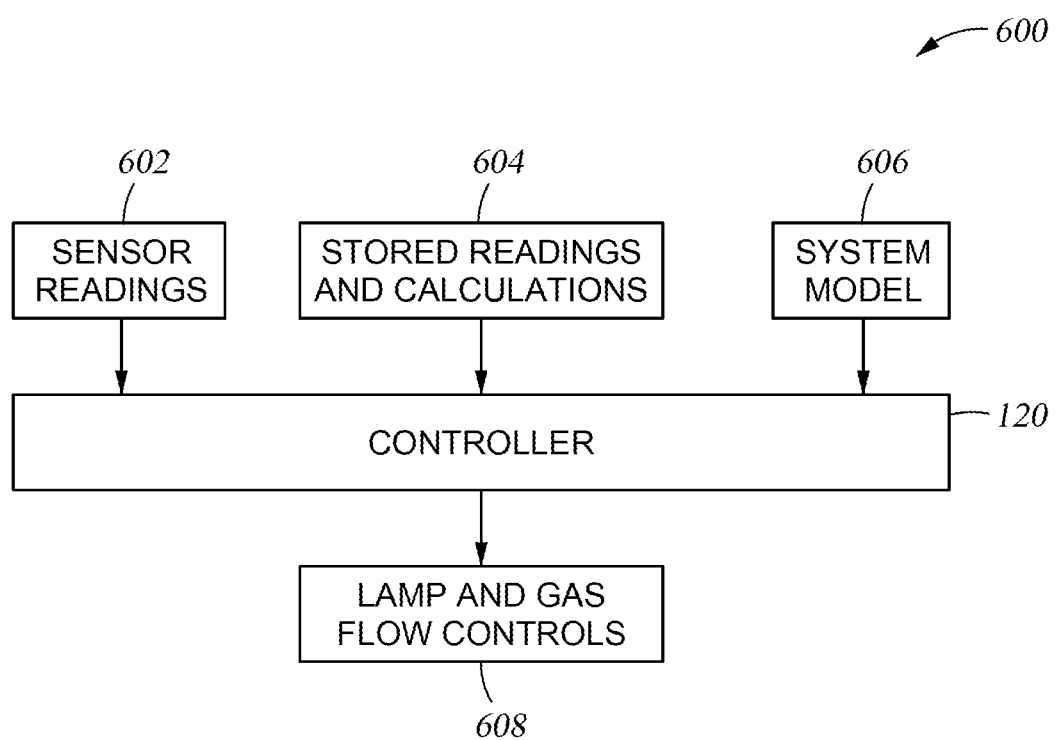
FIG. 6 illustrates a control schematic for use within the deposition chamber of FIG. 1, according to embodiments of the present disclosure.

FIG. 6 illustrates a control schematic 600 for use within the deposition chamber 100 of FIG. 1, according to embodiments of the present disclosure. The controller 120 is configured to receive data or input as sensor readings 602 from each of the growth monitors 310. The controller 120 is equipped with or in communication with a system model 606 of the deposition chamber 100. The system model 606 includes a heating model and a gas flow module. The system model 606 is a program configured to estimate the gas flow and heating within the deposition chamber 100 throughout a deposition process. The controller 120 is further configured to store readings and calculations 604.

The readings and calculations 604 include previous sensor readings 602 as well as any other previous sensor readings within the deposition chamber 100. The readings and calculations 604 further include the stored calculated values from after the sensor readings 602 are measured by the controller 120 and run through the system model 606. Therefore, the controller 120 is configured to both retrieve stored readings and calculations 604 as well as save readings and calculations 604 for future use. Maintaining previous readings and calculations enables the controller 120 to adjust the system model 606 over time to reflect a more accurate version of the deposition chamber 100.

In embodiments described herein, the controller 120 includes a programmable central processing unit (CPU) that is operated with a memory and a mass storage device, an input control unit, and a display unit (not shown). The controller 120 monitors the precursor, process gas, and purge gas flow. Support circuits are coupled to the CPU for supporting the processor in a conventional manner. In some embodiments, the controller 120 includes multiple controllers 120, such that the stored readings and calculations 604 and the system model 606 are stored within a separate controller from the controller 120 which operations the deposition chamber 100. In other embodiments all of the system model 606 and the stored readings and calculations 604 are saved within the controller 120.

The controller 120 is configured to control the heating and gas flow through the deposition chamber 100 by providing an output to the lamps and gas flow controls 608. The lamps and gas flow controls 608 include the upper lamps 141, the lower lamps 143, the process gas source 151, the purge gas source 162, and the exhaust pump 157. The controller 120 may also control the motion assembly 121 within the deposition chamber 100.

The controller 120 is configured to adjust the output to each of the lamps and gas flow controls 608 based off of the sensor readings 602, the system model 606, and the stored readings and calculations 604. The controller 120 includes embedded software and a compensation algorithm to calibrate growth monitor 310 frequency shift to the film thickness on the substrate 102. The film thickness on the substrate 102 may be measured as the substrate 102 leaves the deposition chamber or between process operations to provide a reference for film thickness growth rates measured using the growth monitors 310. The controller 120 may include a machine learning algorithm and may use a regression or clustering technique. The algorithm is an unsupervised or a supervised algorithm.

Figure 7:
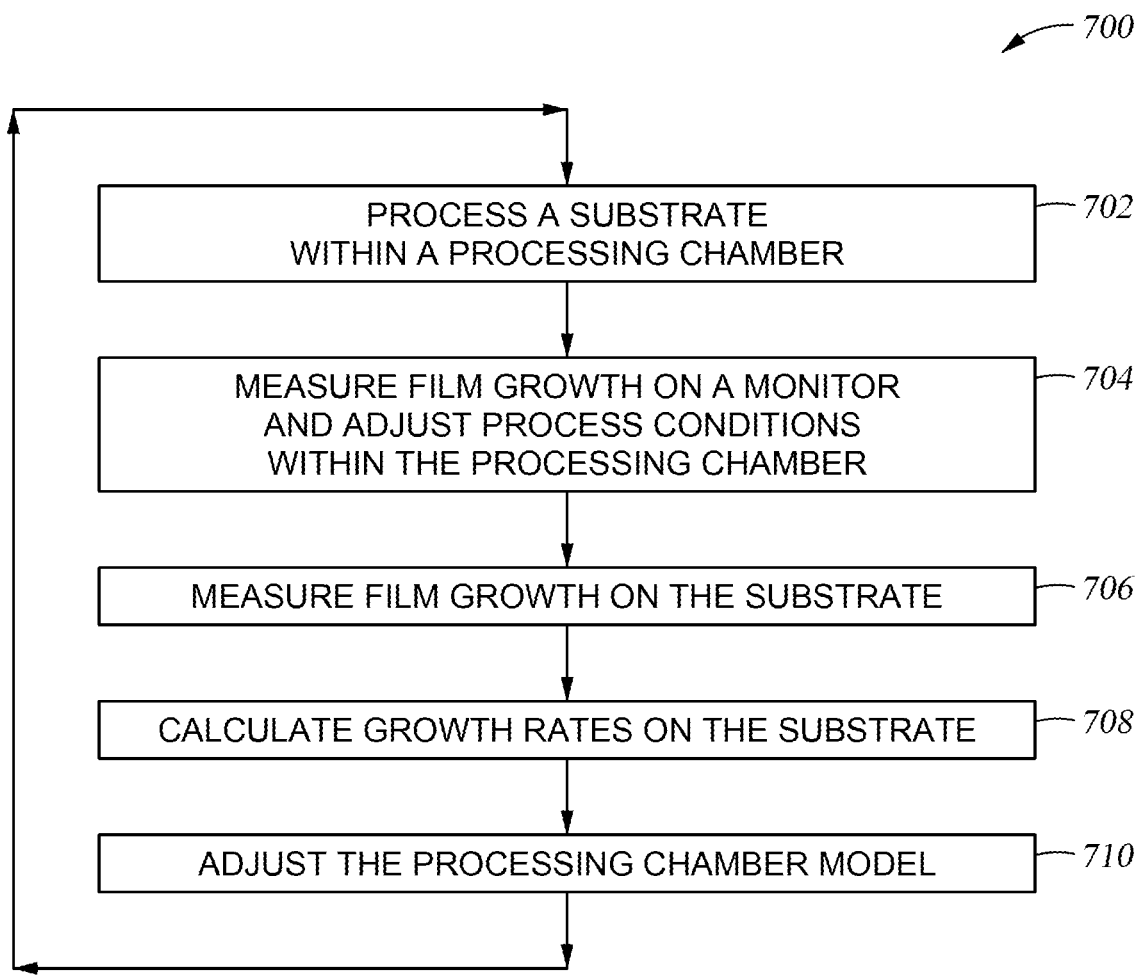
FIG. 7 illustrates a method of adjusting process conditions within the deposition chamber of FIG. 1, according to embodiments of the present disclosure.

FIG. 7 illustrates a method 700 of adjusting process conditions within the deposition chamber 100 of FIG. 1, according to embodiments of the present disclosure. The method 600 utilizes the growth monitors 310 within the deposition chamber 100 as well as the controller 120 described herein to improve film thickness uniformity and properties across the substrate 102.

During the method 700 a first substrate is processed within a processing chamber during an operation 702. The first substrate may be the substrate 102 and the processing chamber is the deposition chamber 100. Processing the first substrate during the operation 702 includes performing a deposition process on the first substrate, such as an epitaxial deposition process. The deposition process grows a film over the first substrate and includes heating the substrate using the upper lamps 141 and the lower lamps 143. Gas is flown through the process volume 136 from the process gas inlets 114 and the purge gas inlets 164 before being removed through the exhaust gas outlets 116.

As the first substrate is being processed within the processing chamber, the growth monitors 310 are used to measure the film thickness growth on the monitors during another operation 704. The measuring of the film thickness growth on the growth monitors 310 is performed as a rolling operation. A controller, such as the controller 120, is configured to receive input from a combination of the growth monitors 310 described with respect to FIGS. 3A-3B. The input is used to estimate film growth on the first substrate. Once the first substrate is done being processing within the processing chamber, the film thickness may be measured using one or more other non-contact sensors within the processing chamber or within an adjacent chamber during another operation 706. Measuring the film growth on the first substrate during the operation 706 is performed in a non-destructive manner, such as by using one or more non-contact sensors. The non-contact sensors may be a laser thickness gauge and may take multiple discreet measurements across the surface of the first substrate or may scan a length of the first substrate.

The non-contact sensors used during the operation 706 are not necessarily utilized for film thickness measurement during substrate processing as the process gases and radiation from the heating sources interfere with sensor readings to reduce reading sensitivity and precision. The growth monitors 310 therefore enable adjustment of the process conditions, such as heating and gas flow, while the first substrate is being processed.

The measurements of the film growth on the first substrate enables the growth rate on the first substrate to be calculated during another operation 708. Calculating the growth rate on the first substrate during the operation 708 verifies the accuracy of the models used within the controller and enable the processing chamber model to be adjusted during another operation 710. Adjusting the processing chamber model during the operation 710 enables better use of the growth monitors 310 for a specific process. Once the model has been adjusted, processing of another substrate, such as a second substrate, is performed and the operations 702-710 are repeated. The operations 702 may be looped to continuously adjust the accuracy of the processing chamber model 710 and improve film thickness growth results. When preventative maintenance is performed on the processing chamber, the processing chamber model may be reset or adjusted and the method 700 begins again. Therefore, film thickness is results are improved continuously between each substrate. This further enables accurate film thickness and overcomes changes in processing chamber properties as films build up on surfaces within the process volume and as lamps age.

Each side of the crystal disposed in the growth monitor can be controlled based on a variety of different deposition processes using purge gases. The front side purging can control the sample window of the epitaxy film growth and the back side continuous purging can be used to control a temperature of the crystal for different epitaxy processes having different precursors. Controlling purging conditions for the sensor can extend the life of the crystal and enable replacing crystals during preventative maintenance of the process chamber.

While the foregoing is directed to embodiments of the present disclosure, other and further embodiments of the disclosure may be devised without departing from the basic scope thereof, and the scope thereof is determined by the claims that follow.

What is claimed is:

1. A film growth monitor comprising:
    a sensor holder comprising:
        a first part comprising a cavity, and
        a second part positioned over a side of the first part;
    a crystal disposed in the cavity of the first part and encased between the first part and the second part, the crystal comprising a front side and a back side;
    an opening formed in the second part of the sensor holder;
    a gas inlet disposed through the first part of the sensor holder to a plenum formed by a portion of the cavity between the back side of the crystal and the first part of the sensor holder;
    a protective coating disposed over the front side of the crystal and disposed at least partially in the opening formed in the second part, wherein the protective coating is formed from alumina or a silicon oxide; and
    a gas outlet formed in the first part of the sensor holder and fluidly coupled to the plenum.

2. The film growth monitor of claim 1, further comprising a front side inlet valve capable of controlling a front side gas flow to the front side of the crystal.

3. The film growth monitor of claim 2, wherein the front side inlet valve is a normally open pneumatic valve.

4. The film growth monitor of claim 1, further comprising a back side inlet valve coupled to the gas inlet, wherein the back side inlet valve is capable of controlling a back side gas flow to the back side of the crystal.

5. The film growth monitor of claim 4, wherein the back side inlet valve is a mass control valve, a restrictor, or a combination thereof.

6. The film growth monitor of claim 1, further comprising a thermocouple coupled to the back side of the crystal.

7. The film growth monitor of claim 1, further comprising a back contact disposed on the back side of the crystal.

8. The film growth monitor of claim 1, further comprising a heat exchanger coupled to the gas inlet.

9. An exhaust passage body for substrate processing, comprising:
    an exhaust plenum;
    an exhaust entry opening formed through a first end of the exhaust passage body and fluidly connected to the exhaust plenum;
    an exhaust exit opening formed through a second end of the exhaust passage body and fluidly connected to the exhaust plenum; and
    at least one growth monitor disposed adjacent to the exhaust exit opening and configured to measure a thickness of a material deposited on the growth monitor, wherein the at least one growth monitor comprises:
    a sensor holder comprising:
        a first part comprising a cavity, and
        a second part positioned over a side of the first part,
    a crystal disposed in the cavity of the first part and encased between the first part and the second part, the crystal comprising a front side and a back side, an opening formed in the second part of the sensor holder,
a gas inlet disposed through the first part of the sensor holder to a sensor plenum formed by a portion of the cavity between the back side of the crystal and the first part of the sensor holder;
a protective coating disposed over the front side of the crystal and disposed at least partially in the opening formed in the second part, wherein the protective coating is formed from alumina or a silicon oxide, and
a gas outlet formed in the first part of the sensor holder and fluidly coupled to the sensor plenum.

10. The exhaust passage body of claim 9, further comprising a fin array including a plurality of fins, wherein the at least one growth monitor is disposed within the fin array.

11. The exhaust passage body of claim 10, further comprising one or more baffles that narrow the exhaust plenum, wherein the exhaust exit opening is smaller in width than the exhaust entry opening.

12. The exhaust passage body of claim 11, wherein the at least one growth monitor is located within or downstream of the exhaust exit opening.

13. The film growth monitor of claim 1, further comprising:
an electrical connection extending through the first part of the sensor holder and to the back side of the crystal.

14. The film growth monitor of claim 13, further comprising:
a front contact contacting the protective coating and disposed between the protective coating and the second part of the sensor holder; and
one or more sealing rings contacting the protective coating and disposed between the protective coating and the second part of the sensor holder.

15. The film growth monitor of claim 14, further comprising:
a front side inlet valve capable of controlling a front side gas flow to the front side of the crystal;
a back side inlet valve fluidly connected to the gas inlet, wherein the back side inlet valve is capable of controlling a back side gas flow to the back side of the crystal;
a heat exchanger fluidly connected to the gas inlet through the back side inlet valve; and
a controller communicatively coupled to the front side inlet valve and the back side inlet valve.

16. A chamber comprising:
a chamber body;
a window, the chamber body and the window at least partially defining a process volume;
a plurality of heat sources configured to heat the process volume;
a substrate support disposed in the process volume;
a liner at least partially lining the chamber body; a plurality of gas inlets;
one or more exhaust gas outlets disposed on an opposite side of the process volume from the plurality of gas inlets;
an exhaust system fluidly connected to the one or more exhaust gas outlets, the exhaust system comprising an exhaust passage body; and
one or more growth monitors disposed within the exhaust passage body, the one or more growth monitors comprising:
a sensor holder, the sensor holder comprising a first part comprising a cavity, and a second part positioned over a side of the first part,
a crystal disposed in the cavity of the first part and encased between the first part and the second part, the crystal comprising a front side and a back side,
an opening formed in the sensor holder,
a gas inlet disposed through the first part of the sensor holder to a plenum formed by a portion of the cavity between the back side of the crystal and the first part of the sensor holder,
a protective coating disposed over the front side of the crystal and disposed at least partially in the opening formed in the second part, wherein the protective coating is formed from alumina or a silicon oxide, and
a gas outlet formed in the first part of the sensor holder and fluidly coupled to the plenum.

17. The chamber of claim 16, wherein the exhaust passage body comprises a fin array including a plurality of fins, wherein the one or more growth monitors are disposed within the fin array.

18. The chamber of claim 16, wherein the exhaust passage body further comprises one or more baffles that narrow one or more exhaust plenums adjacent to one or more exhaust exit openings.

19. The chamber of claim 18, wherein the one or more growth monitors are located within or downstream of the one or more exhaust exit openings.

20. The chamber of claim 16, wherein the opening is formed in the second part of the sensor holder.

* * * * *